United States Patent
Maruyama

(10) Patent No.: US 10,739,207 B2
(45) Date of Patent: Aug. 11, 2020

(54) TEMPERATURE ABNORMALITY DETECTION METHOD FOR POWER CONVERSION APPARATUS, AND TEMPERATURE ABNORMALITY DETECTION DEVICE FOR POWER CONVERSION APPARATUS

(71) Applicant: Nissan Motor Co., Ltd., Yokohama-shi, Kanagawa (JP)

(72) Inventor: Sho Maruyama, Kanagawa (JP)

(73) Assignee: Nissan Motor Co., Ltd., Yokohama (JP)

(*) Notice: Subject to any disclaimer, the term of this patent is extended or adjusted under 35 U.S.C. 154(b) by 85 days.

(21) Appl. No.: 16/302,761

(22) PCT Filed: May 27, 2016

(86) PCT No.: PCT/JP2016/065728
§ 371 (c)(1),
(2) Date: Nov. 19, 2018

(87) PCT Pub. No.: WO2017/203693
PCT Pub. Date: Nov. 30, 2017

(65) Prior Publication Data
US 2020/0182706 A1    Jun. 11, 2020

(51) Int. Cl.
*G01K 15/00*    (2006.01)
*G01K 1/00*    (2006.01)
(Continued)

(52) U.S. Cl.
CPC .............. *G01K 3/08* (2013.01); *H01L 23/473* (2013.01); *H02M 1/32* (2013.01); *H02M 7/5395* (2013.01);
(Continued)

(58) Field of Classification Search
USPC ...................................... 374/1, 141, 152, 166
See application file for complete search history.

(56) References Cited

U.S. PATENT DOCUMENTS 7,607,827 B2 * 10/2009 Karikomi ............... G01K 7/425
361/93.8
7,766,544 B2 * 8/2010 Shibuya ................... B60K 1/04
374/152
(Continued)

FOREIGN PATENT DOCUMENTS

CN            1670497 A        9/2005
CN     101755384 A        6/2010
(Continued)

*Primary Examiner* — Mirellys Jagan
(74) *Attorney, Agent, or Firm* — Global IP Counselors, LLP

(57) ABSTRACT

A temperature abnormality detection method for a power conversion apparatus basically includes a detecting a first power converter temperature, a second power converter temperature and a cooling water temperature and then determining a presence of an abnormality in a preceding stage power converter based on a first temperature difference between the first power converter temperature and the cooling water temperature. The abnormality detection method further includes determining a presence of an abnormality in a subsequent stage power converter based on a second temperature difference between the second power converter temperature and an added temperature that is obtained by adding to the loss component of the preceding stage power converter converted to a temperature to the cooling water temperature.

5 Claims, 6 Drawing Sheets

(51) Int. Cl.
  *G01K 13/00* (2006.01)
  *G01K 3/08* (2006.01)
  *H01L 23/473* (2006.01)
  *H02M 1/32* (2007.01)
  *H02M 7/5395* (2006.01)
  *H05K 7/20* (2006.01)
  *H02P 5/74* (2006.01)

(52) U.S. Cl.
  CPC ... *H05K 7/20927* (2013.01); *H02M 2001/327* (2013.01); *H02P 5/74* (2013.01)

(56) References Cited

U.S. PATENT DOCUMENTS

| | | |
|---|---|---|
| 2010/0193267 A1 | 8/2010 | Nozawa |
| 2015/0204730 A1* | 7/2015 | Daitoku ................. G01K 1/026 374/178 |
| 2017/0245403 A1* | 8/2017 | Ryoo ........................ F25B 9/04 |
| 2019/0178728 A1* | 6/2019 | Kawaguchi ............. H02P 29/68 |

FOREIGN PATENT DOCUMENTS

| | | |
|---|---|---|
| CN | 102253320 B | 6/2013 |
| JP | 2006-238675 A | 9/2006 |
| JP | 2010-68641 A | 3/2010 |
| JP | 2010-136472 A | 6/2010 |
| JP | 2011-172406 A | 9/2011 |
| JP | 2012-44772 A | 3/2012 |
| JP | 2012-70499 A | 4/2012 |
| JP | 2014-45599 A | 3/2014 |

\* cited by examiner

TEMPERATURE ABNORMALITY DETECTION METHOD FOR POWER CONVERSION APPARATUS, AND TEMPERATURE ABNORMALITY DETECTION DEVICE FOR POWER CONVERSION APPARATUS

CROSS-REFERENCE TO RELATED APPLICATIONS

This application is a U.S. national stage application of International Application No. PCT/JP2016/065728, filed on May 27, 2016.

BACKGROUND

Field of the Invention

The present invention relates to a temperature abnormality detection method for a power conversion apparatus and a temperature abnormality detection device for a power conversion apparatus.

Background Information

Conventionally, a technique is known in which a cooling flow path for circulating cooling water is provided in a power conversion apparatus such as an inverter device to protect the device from overheating, and temperature abnormalities are detected in the power conversion apparatus or the cooling flow path (for example, see Japanese Laid Open Patent Application No. 2011-172406—Patent Document 1). In this prior art the difference between the temperature of the cooling water and the temperature of the power conversion apparatus is compared with a temperature threshold value, and the fluctuation range of an indicated torque signal is compared with a torque fluctuation range threshold value. Then, if a state in which the fluctuation range of the indicated torque signal falls below the torque fluctuation range threshold value and the difference value of the temperatures exceeds the temperature threshold continues for longer than a prescribed period of time, the state is determined to be abnormal.

SUMMARY

In recent years, there are case in which a plurality of power conversion apparatuses such as the inverter device described above are installed in a vehicle or the like. However, if the prior art described above is applied to each power conversion apparatus, it becomes necessary to provide a cooling flow path in each power conversion apparatus, and to detect the temperatures of each of the power conversion apparatuses and the cooling water to carry out temperature abnormality detection, which increases the number of temperature sensors and cooling flow paths. This leads to an increase in cost and an increase in the installation space.

In view of the problems described above, an object of the present invention is to provide a temperature abnormality detection method for a power conversion apparatus and a temperature abnormality detection device for a power conversion apparatus with which the number of cooling flow paths and temperature sensors can be reduced, thereby reducing the cost and the size.

In the temperature abnormality detection method for a power conversion apparatus according to the present invention the temperatures of a plurality of power converters are detected, but with regard to the temperature of cooling fluid, only the temperature of cooling fluid that is upstream from these power converters is detected. For the power converter in the preceding stage that is disposed on the upstream side in the cooling flow path, the presence of an abnormality is determined based on the difference between the temperature of this power converter and the temperature of the cooling fluid. For the power converter in the subsequent stage that is disposed downstream from the cooling flow path, the presence of an abnormality is determined based on the difference between the temperature of the subsequent stage power converter and a temperature obtained by converting a loss component of the preceding stage power converter into a temperature which is added to the temperature of the cooling fluid.

In the temperature abnormality detection method for a power conversion apparatus of the present invention it is not necessary to detect the temperature of the cooling fluid upstream from the power converter of the subsequent stage, and the number of necessary temperature sensors can be reduced. Therefore, it is possible to reduce the number of temperature sensors and cooling flow paths, thereby reducing costs and the size of the installation space.

DETAILED DESCRIPTION OF THE EMBODIMENTS

Figure 1:
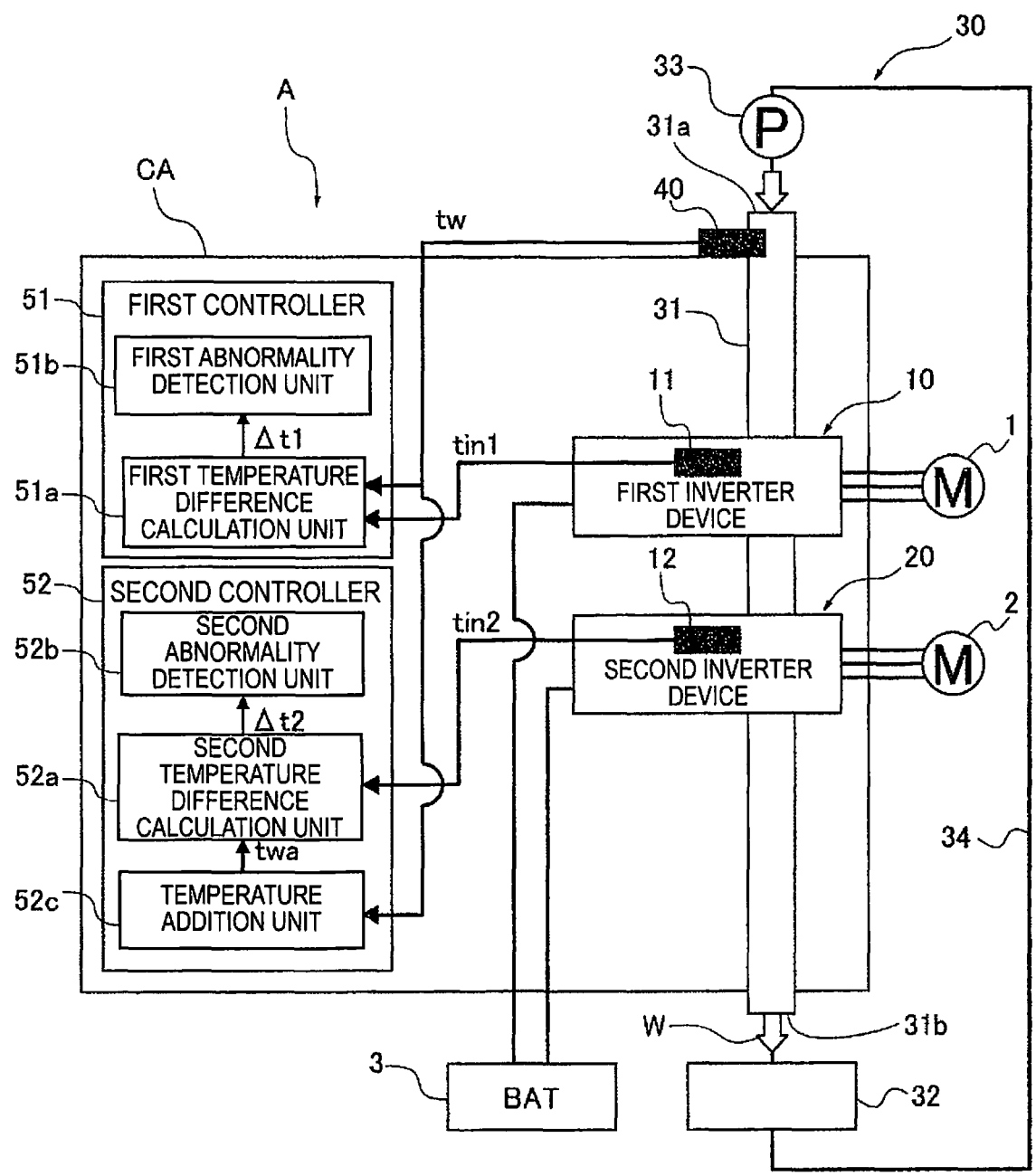
FIG. 1 is an overall view schematically illustrating a power conversion apparatus to which the temperature abnormality detection method of a first embodiment is applied.

In the following, preferred embodiments for realizing the abnormality detection method for a power conversion apparatus of the present invention will be described based on the embodiments illustrated in the drawings.

First Embodiment

A temperature abnormality detection method and a power conversion apparatus for a power conversion apparatus of the first embodiment will be described below.

First, the configuration of a power conversion apparatus A to which the temperature abnormality detection method according to the first embodiment is applied will be described with reference to FIG. 1.

The power conversion apparatus A illustrated in FIG. 1 comprises a first inverter device (a power converter) 10 for driving a first power generation machine 1, and a second inverter device (a power converter) 20 for driving a second power generation machine 2.

The first power generation machine 1 and the second power generation machine 2 are mounted in an electric vehicle, a hybrid vehicle, or the like, which is not shown. The purposes of the two power generation machines 1, 2 are not particularly limited. For example, the two power generation machines 1, 2 can be used as drive sources for supplying driving force to drive wheels, which are not shown. Alternatively, one of the two power generation machines 1, 2 can be used as the drive source, and the other can be used as a generator for generating power by being driven by a drive source, such as an engine, which is not shown.

The two inverter devices 10, 20 are mounted in a casing CA that houses the power conversion apparatus A. The first inverter device 10 converts a direct current, which is the electric power from a battery 3, to an alternating current, and supplies the alternating current to the first power generation machine 1, thereby driving the first power generation machine 1, or converts the alternating current generated by the first power generation machine 1 into a direct current, and supplies the direct current to the battery 3 for charging.

Although not shown, the first inverter device 10 contains a smoothing capacitor and a power module, such as an IGBT module. Additionally, a secondary battery (lithium ion secondary battery, nickel hydrogen battery, or the like) having a voltage control range of about several hundred volts is employed as the battery 3.

As with the first inverter device 10, the second inverter device 20 also can convert a direct current from the battery 3 to an alternating current, and supply the alternating current to the second power generation machine 2, and also can convert the alternating current generated by the second power generation machine 2 into a direct current, and supply the direct current to the battery 3 for charging. Although not shown, this second inverter device 20 also contains a smoothing capacitor and a power module.

Furthermore, the first inverter device 10 and the second inverter device 20 respectively include a first inverter temperature sensor 11 and a second inverter temperature sensor 12, which detect the temperature of an internal heat-generating unit, such as a power module.

In addition, the power conversion apparatus A comprises a cooling device 30. This cooling device 30 comprises a cooling water path 31, a radiator 32, a pump 33, and a circulation path 34, and cools the two inverter devices 10, 20 by circulating cooling water W.

The cooling water path 31 is a flow path that is formed in the casing CA, and that runs from an inflow port 31a at a first end through the first inverter device 10 (the power converter of the preceding stage) and the second inverter device 20 (the power converter of the subsequent stage) in that order, and reaches an outflow port 31b at a second end.

A circulation path 34, which is a flow path extending from the outflow port 31b to the inflow port 31a and provided with the radiator 32 and the pump 33 in the middle thereof, is connected to the cooling water path 31. The pump 33 circulates cooling water W by sucking the cooling water W from the outflow port 31b and pumping the cooling water to the inflow port 31a. The radiator 32 radiates the heat of the cooling water W to the outside air, thereby cooling the cooling water W.

Furthermore, a water temperature sensor 40 is provided in the vicinity of the inflow port 31a, which is upstream from the first inverter device 10 in the cooling water path 31. Detection signals from this water temperature sensor 40 and the first inverter temperature sensor 11 and the second inverter temperature sensor 12 described above are input to a first controller 51 and a second controller 52.

The first controller 51 detects a temperature abnormality of the first inverter device 10, and the second controller 52 detects a temperature abnormality of the second inverter device 20.

Next, the configurations of the first controller 51 and the second controller 52 will be described. The first controller 51 comprises a first temperature difference calculation unit 51a and a first abnormality detection unit 51b. The first temperature difference calculation unit 51a receives inputs of a first inverter temperature tin1 detected by the first inverter temperature sensor 11 and a cooling water temperature tw detected by the water temperature sensor 40, and calculates a first temperature difference $\Delta t1$ (tin1−tw), which is the difference between the two.

The first abnormality detection unit 51b determines an abnormality when the first temperature difference $\Delta t1$ is higher than a first abnormality determination temperature tlim1, and determines that there is no abnormality when the first temperature difference $\Delta t1$ is equal to or less than the first abnormality determination temperature tlim1. That is, if an abnormality occurs in the cooling device 30, or an abnormality occurs in the first inverter device 10 and abnormal heat generation occurs, the first temperature difference $\Delta t1$, which is the difference between the first inverter temperature tin1 and the cooling water temperature tw, increases. Therefore, the first abnormality determination temperature tlim1 is set to a value with which an occurrence of an abnormality can be determined, based on simulations, actual measurements at the time an abnormality occurs, and the like.

The second controller 52 comprises a second temperature difference calculation unit 52a, a second abnormality detection unit 52b and a temperature addition unit 52c. The temperature addition unit 52c sets, as an addition value Tad, a value obtained by converting the loss in the first inverter device 10 during operation into a temperature increase of the cooling water temperature tw, and adds this value to the cooling water temperature tw detected by the water temperature sensor 40 to obtain an added temperature twa. In the first embodiment, the temperature increase due to this loss is set to the increase in the temperature of the cooling water temperature tw due to heat generation of the first inverter device 10 at the time of the maximum loss that is assumed in the first inverter device 10. An example of a time of maximum loss is when the first power generation machine 1 is in a locked state. For example, a locked state is when the wheels of the vehicle are hitting a wheel stop or the like, and the vehicle cannot move forward even when attempting to move forward; that is, a case in which rotation does not occur in the first power generation machine 1, even though the first power generation machine 1 is being energized and driven.

In such a locked state, the energy loss in the first power generation machine 1 becomes maximum, and is lost as thermal energy. As for the addition value Tad to be added to the cooling water temperature tw, such a locked state is actually reproduced, and the relationship between the cooling water temperature tw, the command value to the first power generation machine 1, and the temperature increase (addition value Tad) of the cooling water temperature tw at that time is stored in the form of a map or an arithmetic expression, for example, in the first controller 51. Therefore, the temperature addition unit 52c calculates the addition value Tad from the command value and the cooling water temperature tw at the time the addition is carried out, and adds this value to the cooling water temperature tw to obtain the added temperature twa.

The second temperature difference calculation unit 52a receives as inputs a second inverter temperature tin2 and the added temperature twa, and calculates a second temperature difference Δt2, which is the difference between the two. The second abnormality detection unit 52b determines an abnormality when the second temperature difference Δt2 is higher than a second abnormality determination temperature tlim2, and determines that there is no abnormality when the second temperature difference Δt2 is equal to or less than the second abnormality determination temperature tlim2. This second abnormality determination temperature tlim2 is set in accordance with the second power generation machine 2 and the second inverter device 20, and is not necessarily the same value as the first abnormality determination temperature tlim1.

Figure 2:
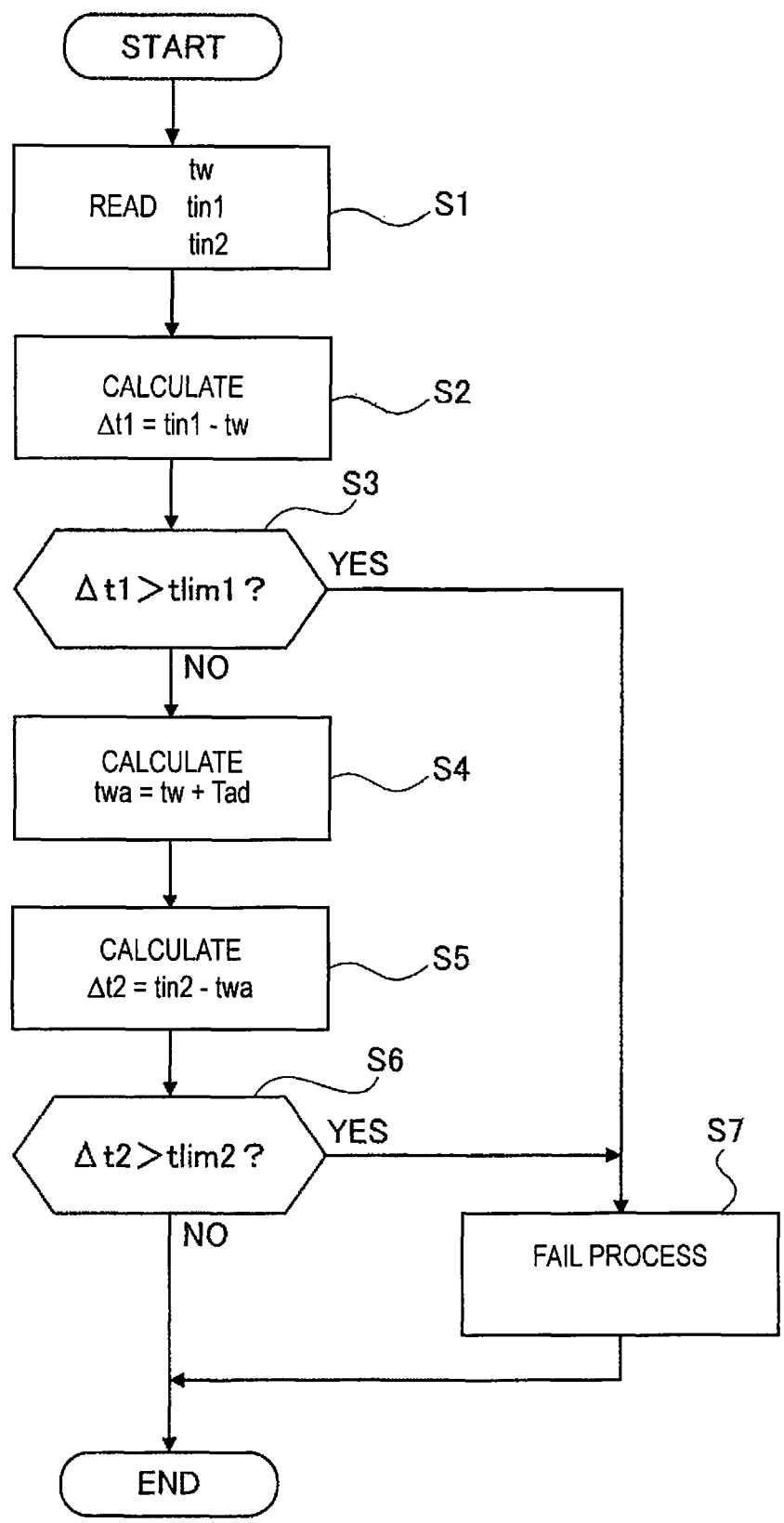
FIG. 2 is a flowchart illustrating the flow of an abnormality determination process of the power conversion apparatus.

Next, the flow of an abnormality determination process carried out by the first controller 51 and the second controller 52 will be described based on the flowchart in FIG. 2. This abnormality determination process is carried out repeatedly every control cycle, which is set in advance.

In the first Step S1, a first inverter temperature tin1, a second inverter temperature tin2, and a cooling water temperature tw, which are detected temperatures respectively from the first inverter temperature sensor 11, the second inverter temperature sensor 12, and the water temperature sensor 40, are read into the two controllers 51, 52.

In the next Step S2, the first temperature difference calculation unit 51a calculates a first temperature difference Δt1, which is the difference between the first inverter temperature tin1 and the cooling water temperature tw, and the process proceeds to Step S3.

In Step S3, the presence of an abnormality in either the first inverter device 10 or the cooling system is determined by the first abnormality detection unit 51b, based on whether the first temperature difference Δt1 is larger than the first abnormality determination temperature tlim1. If an abnormality is determined from Δt1>tlim1 the process proceeds to Step S7, and if it is determined that there is no abnormality (normal) from Δt1≤tlim1 the process proceeds to Step S4.

In Step S4, to which the process proceeds when the first abnormality detection unit 51b determines that there is no abnormality (normal), the temperature addition unit 52c adds an addition value Tad corresponding to the loss component in the first inverter device 10 during operation to the cooling water temperature tw, thereby obtaining the added temperature twa, and the process proceeds to Step S5.

In Step S5, the second temperature difference calculation unit 52a calculates a second temperature difference Δt2, which is the difference between the second inverter temperature tin2 and the added temperature twa, and the process proceeds to Step S6.

In Step S6, the presence of an abnormality in either the second inverter device 20 or the cooling system is determined by the second abnormality detection unit 52b, based on whether the second temperature difference Δt2 is larger than the second abnormality determination temperature tlim2. If an abnormality is determined from Δt2>tlim2, the process proceeds to Step S7, and if it is determined that there is no abnormality (normal) from Δt2≤tlim2, the first abnormality determination process is ended.

In Step S7, to which the process proceeds when an abnormality is determined in either Step S3 or Step S6, a preset fail process is executed. This fail process can be any process that suppresses heat generation in the two power generation machines 1, 2; for example, the process may be one whereby the output of one of the two power generation machines 1, 2 is suppressed by a predetermined amount or is stopped.

(Operation of the First Embodiment)

Next, the operation of the first embodiment will be described.

When the inverter devices 10, 20 are driven a loss occurs in the switching element or the power module, which are not shown, heat corresponding to the loss component is generated, and the inverter temperatures tin2, tin2 increase. In addition, each inverter device 10, 20 is cooled by the cooling device 30, and, accordingly the cooling water temperature tw in the cooling water path 31 is increased due to the heat generation of the first inverter device 10, and this increased cooling water temperature tw is further increased due to the heat generation of the second inverter device 20. This cooling water the temperature of which has increased is cooled by the radiation of heat by the radiator 32, and then is supplied again to the cooling water path 31.

Here, if an abnormality occurs in the cooling device 30, or if a switching element or a power module of the inverter devices 10, 20 generates abnormal heat, the temperature difference between the cooling water temperature tw of the cooling water path 31 and each inverter temperature tin1, tin2 increases.

Therefore, in order to detect the temperature difference between each inverter temperature tin1, tin2 and the cooling water temperature tw accurately it is necessary to add a water temperature sensor that detects the cooling water temperature that has increased due to the heat generation of the first inverter device 10.

However, in that case the number of water temperature sensors increases, which leads to increased costs. In addition, it is necessary to provide a water temperature sensor in a cooling water path 31 formed in the casing CA of the power conversion apparatus A, which requires labor for the installation. In particular, installation is relatively easy if this cooling water path 31 is a pipeline or the like that is independent of the casing CA, but if the cooling water path is integrally formed with the casing CA, it is difficult to carry out installation such that the cooling water temperature tw can be accurately detected and high sealing performance can be ensured.

However, if the abnormality determination of the second inverter device 20 is carried out based on the difference between the second inverter temperature tin2 and the cooling water temperature tw detected by the water temperature sensor 40, which is lower than the actual cooling water temperature of the second inverter device 20, this difference will be a value that is larger than the actual difference. Accordingly, the abnormality determination accuracy decreases, and the possibility that an abnormality will be erroneously determined and a fail process will be executed increases. That is, there is the risk that the abnormality detection accuracy will decrease, and that the operation range of the power conversion apparatus A will be reduced.

In contrast thereto, in the first embodiment an addition value Tad obtained by converting the loss component of the first inverter device 10 is used with the cooling water temperature tw detected by the water temperature sensor 40, for the abnormality determination for the second inverter device 20. Accordingly, the second temperature difference (Δt2) between the second inverter temperature tin2 and the cooling water temperature in the second inverter device 20 is more accurate than when the cooling water temperature tw detected by the water temperature sensor 40 is used as is, and the abnormality detection accuracy is improved. In addition, because the detection of the water temperature is carried out only by a water temperature sensor 40 that is on the upstream side in the cooling water path 31, it is possible to suppress the cost compared to when a water temperature sensor is separately added in the power conversion apparatus A.

Additionally, because an addition value Tad that is set in advance based on actual measurement values is used in the temperature addition unit 52c, the configuration of the temperature addition unit 52c of the second controller 52 can be simplified, and the cost can be reduced. Additionally, a value set based on the temperature due to the maximum loss assumed in the first inverter device 10 is used as the addition value Tad. Accordingly, the actual temperature increase of the cooling water W due to heat generation of the first inverter device 10 will not exceed the addition value Tad, so it is possible to prevent an erroneous determination in which is the device is determined to be normal even though an abnormality has occurred.

The effects of the first embodiment are as follows.

1) The temperature abnormality detection method for a power conversion apparatus A according to the first embodiment is a temperature abnormality detection method for a power conversion apparatus A provided with a first inverter device 10 and a second inverter device 20 as a plurality of power converters that convert and transmit electric power, and a cooling water path 31 that passes through the two inverter devices 10, 20 and cools each of the inverter devices 10, 20, the method comprising: a step (S1) for detecting the temperatures (first inverter temperature tin1, second inverter temperature tin2) of the two inverter devices 10, 20, detecting the temperature (cooling water temperature tw) of the cooling water in the cooling water path 31 on the upstream side of the two inverter devices 10, 20, and reading these detected temperatures; a step (S3) for determining a presence of an abnormality in the first inverter device 10 from among the two inverter devices 10, 20, as a preceding stage power converter disposed upstream in the cooling water path 31 based on a first temperature difference Δt1 between the first inverter temperature tint and the cooling water temperature tw; and a step (S6) for determining a presence of an abnormality in the second inverter device 20 as a subsequent stage power converter disposed downstream from the first inverter device 10 by calculating an added temperature twa (Step S4) obtained by converting a loss component of the first inverter device 10 into a temperature (addition value Tad) that is added to the cooling water temperature tw, calculating a second temperature difference Δt2 between this added temperature twa and the second inverter temperature tin2 (Step S5), and making the determination based on this second temperature difference Δt2.

Therefore, in a power conversion apparatus A equipped with first and second inverter devices 10, 20 as power converters, the number of water temperature sensors 40 can be set to "1," thereby reducing the cost, and enabling abnormality detection of the two inverter devices 10, 20 and the cooling system to be carried out with high accuracy.

2) In the temperature abnormality detection method for a power conversion apparatus A according to the first embodiment, the temperature (addition value Tad) obtained by converting the loss component is set to a value based on a temperature that is converted from a maximum loss assumed in the first inverter device 10.

Therefore, it is possible to simplify the calculation in the temperature addition unit 52c and reduce the cost, and erroneous determinations, in which the device is determined to be normal even though an abnormality has occurred, can be prevented, thereby obtaining high detection accuracy.

3) A temperature abnormality detection device for a power conversion apparatus A according to the first embodiment comprises: a first inverter device 10 and a second inverter device 20 as a plurality of power converters that convert and transmit electric power; a cooling water path 31 that passes through the two inverter devices 10, 20 and cools each of the inverter devices 10, 20; a first inverter temperature sensor 11 and a second inverter temperature sensor 12 as power converter temperature sensors that detect the temperature of each inverter device 10, 20; a water temperature sensor 40 that detects the temperature of cooling water of a cooling water path 31 upstream from the two inverter devices 10, 20; a first temperature difference calculation unit 51a as a preceding stage temperature difference calculation unit that calculates a first temperature difference Δt1, which is the difference between a cooling water temperature tw and a first inverter temperature tin1, which is the temperature of the first inverter device 10; a first abnormality detection unit 51b as a preceding stage power converter abnormality detection unit that carries out abnormality determination based on a first temperature difference Δt1 calculated by the first temperature difference calculation unit 51a; a temperature addition unit 52c that converts the loss component of the first inverter device 10 into temperature and adds the same to the cooling water temperature tw; a second temperature difference calculation unit 52a as a subsequent stage temperature difference calculation unit that calculates a second temperature difference Δt2, which is the difference between the added temperature twa calculated by the temperature addition unit 52c and the second inverter temperature tin2; and a second abnormality detection unit 52b as a subsequent stage power converter abnormality detection unit that carries out abnormality determination based on a second temperature difference Δt2 calculated by the second temperature difference calculation unit 52a.

Therefore, in a power conversion apparatus A equipped with first and second inverter devices 10, 20 as power converters, the number of water temperature sensors 40 can be set to "1," thereby reducing the cost, and enabling abnormality detection of the two inverter devices 10, 20 and the cooling system to be carried out with high accuracy.

Other Embodiments

In the following a temperature abnormality detection method and a temperature abnormality detection device for a power conversion apparatus of another embodiment will be described. When describing the other embodiment, configurations common to other embodiments are given the same reference symbols as those embodiments, and the descriptions thereof are omitted, with only the differences with respect to those embodiments being described.

Second Embodiment

The second embodiment is an example in which the method of converting the loss component of the first inverter device 10 into temperature and adding the same to the cooling water temperature tw is different from that of the first embodiment. That is, in the second embodiment, a value calculated based on loss calculation information that includes semiconductor characteristics, the carrier frequency, and the current supplied to the first inverter device 10, is used as the temperature obtained by converting the loss component of the first inverter device 10.

Figure 3:
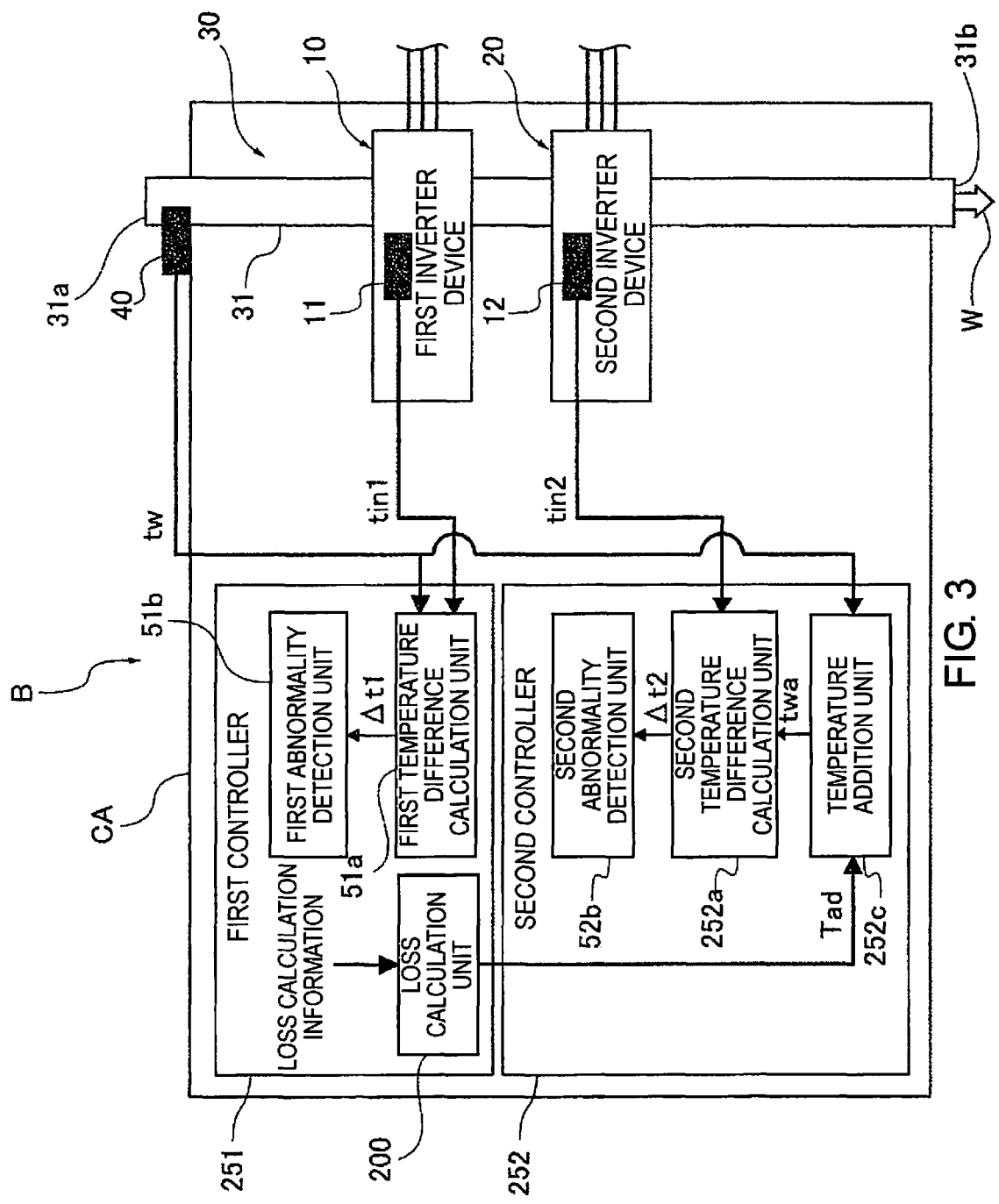
FIG. 3 is an overall view schematically illustrating a power conversion apparatus to which the temperature abnormality detection method of a second embodiment is applied.

FIG. 3 is an overall view schematically illustrating a power conversion apparatus B to which the temperature abnormality detection method of the second embodiment is applied. In the temperature addition unit 252c of the second controller 252 illustrated in FIG. 3, an addition value calculated by a loss calculation unit 200 provided in the first controller 251 is used as the addition value, which is the temperature of the loss component.

In addition, the loss calculation unit 200 calculates the addition value Tad based on loss calculation information that includes the semiconductor characteristics, the carrier frequency f, and the current I in the first inverter device 10. The first inverter device 10 comprises a well-known bridge-connected insulated gate bipolar transistor (hereinafter referred to as IGBT), and a diode (Free Wheeling Diode, hereinafter referred to as FWD).

Therefore, the steady loss in the IGBT of the first inverter device 10 is calculated using the following formula (1), and the switching loss in the IGBT is calculated using the following formula (2). In addition, the steady loss in the FWD of the first inverter device 10 is calculated using the following formula (3), and the switching loss in the FWD is calculated using the following formula (4). The power module loss in the first inverter device 10 is then calculated from these values using the following formula (5).

Formula 1:
$$P(Isat) = \frac{1}{2\pi} \int_0^\pi (Ic \times \sin x) \times (Vce(sat) \times \sin x) \times \frac{1 + D \times \sin(x + \theta)}{2} dx \quad (1)$$

Formula 2:
$$P(Isw) = Esw \times f \times \frac{1}{\pi} \quad (2)$$

Formula 3:
$$P(Fsat) = \frac{1}{2\pi} \int_0^\pi (-Ic \times \sin x) \times (-Vf \times \sin x) \times \frac{1 + D \times \sin(x + \theta)}{2} dx \quad (3)$$

Formula 4:
$$P(Fsw) = Err \times f \times \frac{1}{2} \quad (4)$$

Formula 5:
$$P(PM) = \{P(Isat) + P(Isw)\} \times N(I) + \{P(Fsat) + P(Fsw)\} \times N(F) \quad (5)$$

Ic; Switching element current of IGBT (first power generation machine current)
Vce(sat); ON voltage of switching element of IGBT
D; PWM modulation factor
Esw; Switching loss per 1 pulse of IGBT
f: PWM carrier frequency
N(1); number of IGBT chips
N(F); number of FWD chips
Vf: ON voltage of switching element of FWD
Err; Switching loss per 1 pulse of FWD Furthermore, the loss in the first inverter device 10 obtained from the formulas above (power module loss P (PM)) is converted to temperature, and an addition value Tad corresponding to the temperature increase of the cooling water is calculated. This addition value Tad is obtained by repeatedly conducting experiments in advance, and using a table or a calculation formula that is set so as to be able to obtain the value in accordance with the power module loss P (PM) and the cooling water temperature tw.

In addition, the temperature addition unit 252c adds the addition value Tad to the cooling water temperature tw detected by the water temperature sensor 40, and the calculation itself is the same as that of the temperature addition unit 52c shown in the first embodiment.

Accordingly, in the second embodiment a value that is closer to the temperature increase of the cooling water W due to heat generation caused by actual loss in the first inverter device 10 can be set as the addition value Tad, and therefore the abnormality detection accuracy is even higher.

2-1) In a temperature abnormality detection method for a power conversion apparatus B according to the second embodiment, the temperature addition unit 252c uses, as the addition value Tad, which is the temperature obtained by converting the loss component to be added to the cooling water temperature tw, a value calculated based on loss calculation information that includes the number of FWD chips N(F), the number of IGBT chips N(I), a PWM modulation factor D as a semiconductor characteristic, a carrier frequency f, a current Ic and voltage Vce(sat) in the power module of the first inverter device 10.

Therefore, it is possible to obtain the optimum addition value Tad corresponding to the operating state of the first inverter device 10, and to carry out a more accurate abnormality detection. It should be noted that the addition value Tad can be obtained based on any one of the current Ic, the voltage Vce(sat), the semiconductor characteristic (carrier frequency f, PWM modulation factor D, number of IGBT chips N(1), and number of FWD chips N(F)).

Third Embodiment

The third embodiment is an example in which the method of converting the loss component of the first inverter device 10 into temperature and adding the same to the cooling water temperature tw to obtain the addition value Tad is different from those of the first and second embodiments.

That is, in the third embodiment, a value estimated based on the first temperature difference Δt1 between the temperature of the first inverter device 10 and the cooling water temperature tw is used as the addition value Tad that is added after the loss component of the first inverter device 10 is converted to temperature.

Figure 4:
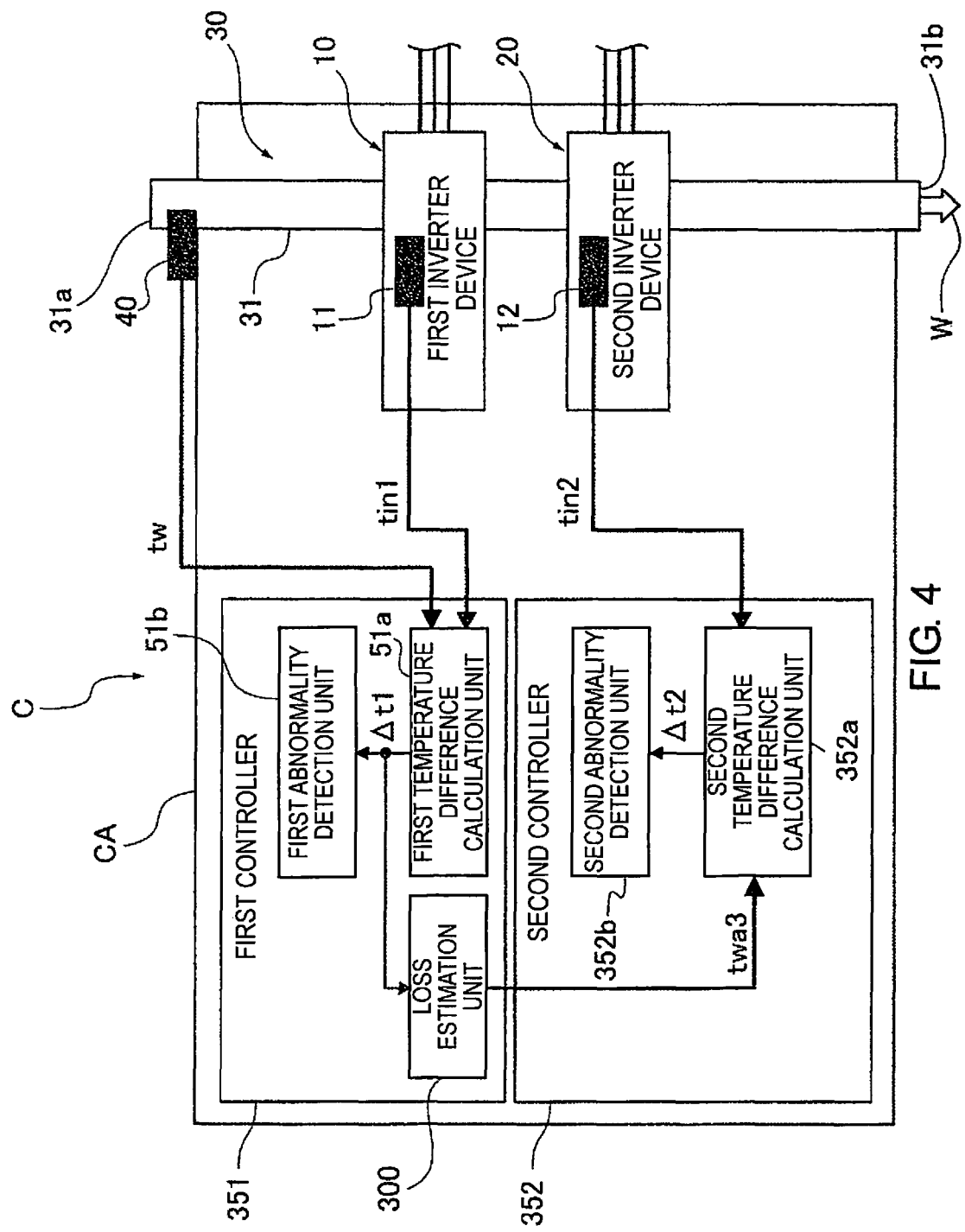
FIG. 4 is an overall view schematically illustrating a power conversion apparatus to which the temperature abnormality detection method of the second embodiment is applied.

FIG. 4 is an overall view schematically illustrating a power conversion apparatus C to which the temperature abnormality detection method of the third embodiment is applied. The second temperature difference calculation unit 352a of the second controller 352 shown in FIG. 4 calculates a second temperature difference Δt2 between the added temperature twa3, estimated by a loss estimation unit 300, and the second inverter temperature tin2.

Here, the loss estimation unit 300 receives as an input the first temperature difference Δt1 calculated by the first temperature difference calculation unit 51a, and back-calculates the loss in the first inverter device 10 from this first temperature difference Δt1. Furthermore, the loss estimation unit 300 estimates an addition value corresponding to the temperature increase component of the cooling water due to this loss component, and calculates an added temperature twa3 obtained by adding this addition value to the cooling water temperature tw. As for this addition value, values corresponding to the first temperature difference Δt1 and the driving state (for example, powering, regeneration, locking, etc.) of the first power generation machine 1 at that time are stored in the first controller 51 in the form of a map. The second temperature difference calculation unit 352*a* calculates a second temperature difference Δt2 between this added temperature twa3 and the second inverter temperature tin2.

Thus, in the third embodiment the temperature increase of the cooling water corresponding to the estimated loss component of the first inverter device 10 is estimated based on the first temperature difference Δt1. Accordingly, it is possible to obtain the actual cooling water temperature in the second inverter device 20 as the added temperature twa3, thereby increasing the abnormality detection accuracy.

3-1) In a temperature abnormality detection method for a power conversion apparatus C according to the third embodiment, a value estimated based on a first temperature difference Δt1, which is the difference between the first inverter temperature tin1, which is the temperature of the first inverter device 10, and the cooling water temperature tw, is used as the temperature of the loss component that is added in the second temperature difference calculation unit 352*a*.

That is, the heat generation state of the first inverter device 10 is estimated based on the difference between the first inverter temperature tin1 and the cooling water tw, thereby enabling the addition value to be obtained with high accuracy. Therefore, the cooling water temperature in the second inverter device 20 can be estimated with high accuracy based on this highly accurate addition value, and abnormality detection can be carried out with high accuracy on that basis.

Fourth Embodiment

Figure 5:
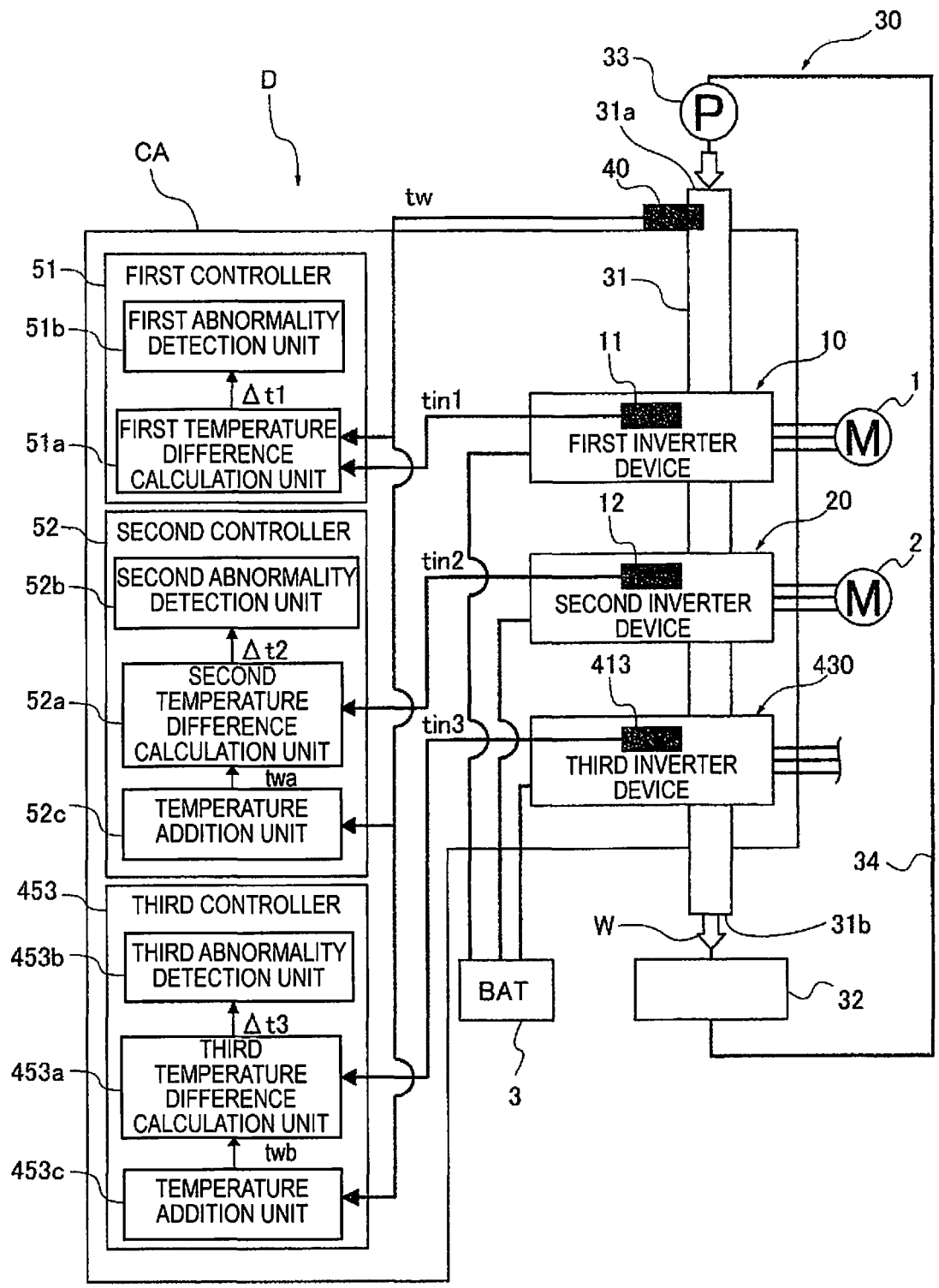
FIG. 5 is an overall view schematically illustrating a power conversion apparatus of a third embodiment.

The power conversion apparatus D of the fourth embodiment is a modified example of the first embodiment and, as illustrated in FIG. 5, is an example in which a third inverter device 430 for driving a third power generation machine (not shown) is added in a subsequent stage of the cooling water path 31.

A third controller 453, which carries out an abnormality determination for this third inverter device 430, comprises a third temperature difference calculation unit 453*a*, a third abnormality detection unit 453*b*, and a temperature addition unit 453*c*. The temperature addition unit 453*c* takes, as an addition value Tad, a value obtained by converting the loss in the first inverter device 10 during operation and the loss in the second inverter device 20 during operation into a temperature increase of the cooling water temperature tw, and adds this value to the cooling water temperature tw detected by the water temperature sensor 40 to obtain an added temperature twb. As in the first embodiment, the temperature increase due to this loss is set to the increase in the temperature of the cooling water temperature tw due to heat generation at the time of the maximum loss assumed in the two inverter devices 10, 20.

The third temperature difference calculation unit 453*a* then receives as inputs a third inverter temperature tin3 detected by the third inverter temperature sensor 413, and the added temperature twb, and calculates a third temperature difference Δt3, which is the difference between the two.

The third abnormality detection unit 453*b* determines an abnormality when the third temperature difference Δt3 is higher than a third abnormality determination temperature (tlim3), and determines that there is no abnormality when the third temperature difference Δt3 is equal to or less than the third abnormality determination temperature (tlim3). This third abnormality determination temperature tlim3 is set in accordance with a third rotary electric machine (not shown) and the third inverter device 430.

Therefore, in the fourth embodiment the effects 1) to 3) described in the first embodiment can be obtained even if the number of inverter devices increases.

Fifth Embodiment

Figure 6:
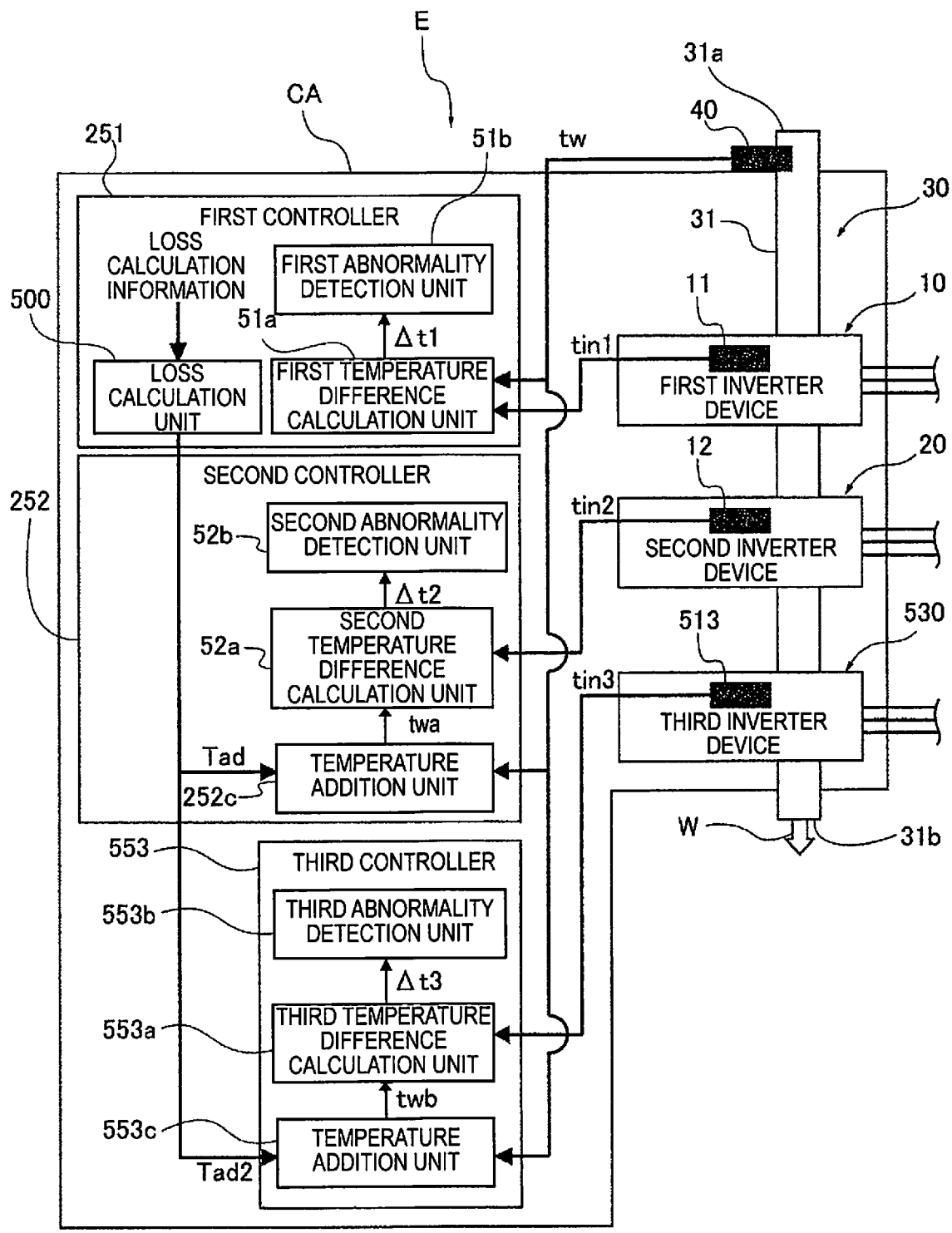
FIG. 6 is an overall view schematically illustrating a power conversion apparatus of a fourth embodiment.

The power conversion apparatus E of the fifth embodiment is a modified example of the second embodiment and, as illustrated in FIG. 6, is an example in which a third inverter device 530 is added in a subsequent stage of the cooling water path 31, in the same manner as the fourth embodiment described above. In the temperature addition unit 553*c* of the third controller 553 illustrated in FIG. 6, an addition value Tad2 calculated by a loss calculation unit 500 provided in the first controller 251 is used as the addition value, which is the temperature of the loss component.

In addition, the loss calculation unit 500 calculates the addition value Tad based on loss calculation information that includes the semiconductor characteristics, the carrier frequency f, and the current I in the first inverter device 10, in the same manner as the second embodiment. In addition, the loss calculation unit 500 calculates the addition value Tad2 based on loss calculation information that includes the semiconductor characteristics, the carrier frequency f, and the current I in the second inverter device 20. The calculation of this addition value Tad2 can be carried out using a table or a calculation formula in the same manner as in the second embodiment. In addition, the addition values Tad, Tad2 can be calculated based on any one of the current I, the carrier frequency f, and the semiconductor characteristics.

The third temperature difference calculation unit 553*a* then receives as inputs a third inverter temperature tin3 detected by the third inverter temperature sensor 513 and the added temperature twb calculated using the addition value Tad2, and calculates a third temperature difference Δt3, which is the difference between the two.

The third abnormality detection unit 553*b* determines an abnormality when the third temperature difference Δt3 is higher than a third abnormality determination temperature (tlim3), and determines that there is no abnormality when the third temperature difference Δt3 is equal to or less than the third abnormality determination temperature (tlim3).

Therefore, in the fifth embodiment, the effect described in 2-1) above can be obtained even if the number of inverter devices increases. In addition, although not shown, when the number of inverter devices thus increases, the added temperature twb can be calculated using the same method as in the third embodiment when detecting an abnormality of the third inverter device. That is, in this case a value estimated based on the second temperature difference Δt2 in the second inverter device 20 is used as the temperature of the loss component to be added in the third temperature difference calculation unit.

The temperature abnormality detection method for a power conversion apparatus and the temperature abnormality detection device for a power conversion apparatus of the present invention were described above based on embodiments, but specific configurations thereof are not limited to these embodiments, and various modifications and additions to the design can be made without departing from the scope of the invention according to each claim in the Claims.

For example, in the embodiments inverter devices were shown as the plurality of power converters for converting and transmitting electric power, but the power converters are not limited to inverter devices; other power converters such as converters may be used as well. Accordingly, in the embodiments a power generation machine was shown as the output target of the power converters, but the output target is not limited thereto, and other devices, such as a battery, can be used.

Additionally, cooling water was shown as the coolant that flows through the cooling flow path, but the coolant is not limited thereto; gas or fluids other than water may be used.

Furthermore, in the first embodiment the temperature increase of the water temperature at the time of maximum loss assumed in the first inverter device was set as the temperature to which the temperature of the loss component of the power converter of the preceding stage is added, but no limitation is imposed thereby. For example, it may be set as the temperature increase of the water temperature at the time of maximum loss in the driving state of the first power generation machine, in accordance with that driving state. That is, it may be set as the temperature increase at the time of maximum loss for each driving state, such a powering, regeneration, and locked.

Additionally, in the second embodiment an example was shown in which the temperature increase of the loss component is obtained based on formulas (1) to (5); however, it is not limited to the formulas (1) to (5), as long as the value is calculated based on loss calculation information that includes the semiconductor characteristics, the carrier frequency, and the current supplied to the power converter.

In addition, the number of power converters is not limited to "2" and "3" illustrated in the embodiments; four or more can be provided.

The invention claimed is:

1. A temperature abnormality detection method for a power conversion apparatus provided with a plurality of power converters that convert and transmit electric power, and a cooling flow path that passes through the plurality of power converters and cools each of the power converters, the method comprising:
    detecting temperatures of the plurality of power converters and detecting a temperature of a cooling fluid of the cooling flow path on an upstream side of the plurality of power converters;
    determining a presence of an abnormality in a preceding stage power converter disposed upstream in the cooling flow path from among the plurality of power converters based on a difference between a temperature of the preceding stage power converter and the temperature of the cooling fluid; and
    determining a presence of an abnormality in a subsequent stage power converter disposed downstream from the preceding stage power converter in the cooling flow path based on a difference between the temperature of the subsequent stage power converter and a temperature obtained by converting a loss component of the preceding stage power converter into a temperature which is added to the temperature of the cooling fluid.

2. The temperature abnormality detection method according to claim 1, wherein
    the temperature obtained by converting the loss component is set to a value based on a temperature that is converted from a maximum loss assumed in the preceding stage power converter.

3. The temperature abnormality detection method according to claim 1, wherein
    the temperature obtained by converting the loss component is set to a value that is calculated based on loss calculation information that includes at least one of a semiconductor characteristic, a carrier frequency or a current in the preceding stage power converter.

4. The temperature abnormality detection method according to claim 1, wherein
    the temperature obtained by converting the loss component is set to a value that is estimated based on the difference between the temperature of the preceding stage power converter and the temperature of the cooling fluid.

5. A temperature abnormality detection device for a power conversion apparatus, the temperature abnormality detection device comprising:
    a plurality of power converters that convert and transmit electric power;
    a cooling flow path that passes through the plurality of power converters and cools each of the power converters;
    a plurality of power converter temperature sensors that detect temperatures of the plurality of power converters;
    a cooling fluid temperature sensor that detects a temperature of a cooling fluid of the cooling flow path that is upstream from the plurality of power converters;
    a preceding stage temperature difference calculation unit that calculates a difference between a cooling fluid temperature and a temperature of a preceding stage power converter disposed upstream in the cooling flow path;
    a preceding stage power converter abnormality detection unit that carries out abnormality determination based on the difference calculated by the preceding stage temperature difference calculation unit;
    a temperature addition unit that converts a loss component of the preceding stage power converter into a temperature and adds the temperature corresponding to the loss component to the cooling fluid temperature;
    a subsequent stage temperature difference calculation unit that calculates a difference between the temperature calculated by the temperature addition unit and a temperature of a subsequent stage power converter disposed downstream from the preceding stage power converter in the cooling flow path; and
    a subsequent stage power converter abnormality detection unit that carries out abnormality determination based on the difference calculated by the subsequent stage temperature difference calculation unit.

* * * * *